United States Patent
Chang et al.

(10) Patent No.: US 9,391,139 B1
(45) Date of Patent: Jul. 12, 2016

(54) TOP-SIDE CONTACT STRUCTURE AND FABRICATION METHOD THEREOF

(71) Applicant: VANGUARD INTERNATIONAL SEMICONDUCTOR CORPORATION, Hsinchu (TW)

(72) Inventors: Hsiung-Shih Chang, Taichung (TW); Jui-Chun Chang, Hsinchu (TW); Li-Che Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/862,321

(22) Filed: Sep. 23, 2015

(51) Int. Cl.
- H01L 21/76 (2006.01)
- H01L 29/06 (2006.01)
- H01L 23/48 (2006.01)
- H01L 21/762 (2006.01)
- H01L 21/768 (2006.01)
- H01L 21/311 (2006.01)

(52) U.S. Cl.
CPC ...... *H01L 29/0649* (2013.01); *H01L 21/31111* (2013.01); *H01L 21/76224* (2013.01); *H01L 21/76802* (2013.01); *H01L 21/76877* (2013.01); *H01L 23/481* (2013.01)

(58) Field of Classification Search
USPC ........................................................ 257/508
See application file for complete search history.

(56) References Cited

U.S. PATENT DOCUMENTS

| | | | | |
|---|---|---|---|---|
| 5,977,597 A * | 11/1999 | Honda | ........... | G11C 11/41 257/369 |
| 8,618,602 B2 * | 12/2013 | Oyu | ........... | H01L 27/10876 257/255 |
| 8,723,297 B2 * | 5/2014 | Son | ........... | H01L 21/02057 257/296 |
| 2008/0055504 A1 * | 3/2008 | Choi | ........... | G02F 1/133555 349/38 |
| 2013/0288472 A1 * | 10/2013 | Choi | ........... | H01L 29/66621 438/587 |
| 2014/0134839 A1 * | 5/2014 | Kim | ........... | H01L 29/4236 438/652 |

* cited by examiner

*Primary Examiner* — Thao P Le
(74) *Attorney, Agent, or Firm* — Birch, Stewart, Kolasch & Birch, LLP

(57) ABSTRACT

A top-side contact structure is provided. The top-side contact structure includes a substrate. The substrate includes a first semiconductor layer, an insulating layer on the first semiconductor layer, and a second semiconductor layer on the insulating layer. The top-side contact structure also includes a first trench and a second trench formed in the second semiconductor layer and respectively extending along a first direction and a second direction. The first trench and the second trench connect to each other at an intersection point. The top-side contact structure also includes an insulating material filling the first trench and the second trench. The top-side contact structure also includes a contact plug formed at the intersection point and directly contacting the first semiconductor layer. A method for fabricating a top-side contact structure is also provided.

20 Claims, 8 Drawing Sheets

TOP-SIDE CONTACT STRUCTURE AND FABRICATION METHOD THEREOF

BACKGROUND

1. Field of the Disclosure

The present disclosure relates to a semiconductor device, and in particular it relates to a top-side contact structure and a method for fabricating a top-side contact structure.

2. Description of the Related Art

In semiconductor devices, in order to prevent interference, deep trench isolation (DTI) structures and an insulating layer in the substrate may be used to form a closed isolation region which electrically isolates the internal devices and the external devices. When bias or ground needs to be applied to the above isolation region, a bottom-side contact structure or a top-side contact structure may be formed in the substrate.

In the conventional art, both the bottom-side contact structure and the top-side contact structure need additional photomasks to define the position of the contact hole. Accordingly, in order to reduce the complexity of the process and the manufacturing cost, there is need for a novel contact structure and its fabrication method in the art.

BRIEF SUMMARY

The disclosure provides a top-side contact structure. The top-side contact structure includes a substrate. The substrate includes a first semiconductor layer, an insulating layer on the first semiconductor layer, and a second semiconductor layer on the insulating layer. The top-side contact structure also includes a first trench and a second trench formed in the second semiconductor layer and respectively extending along a first direction and a second direction. The first trench and the second trench connect to each other at an intersection point. The top-side contact structure also includes an insulating material filling the first trench and the second trench. The top-side contact structure also includes a contact plug formed at the intersection point and directly contacting the first semiconductor layer.

The disclosure also provides a method for fabricating a top-side contact structure. The method includes providing a substrate having a first semiconductor layer, an insulating layer on the first semiconductor layer, and a second semiconductor layer on the insulating layer. The method also includes forming a first trench formed in the second semiconductor layer and extending along a first direction. The method also includes forming a second trench formed in the second semiconductor layer and extending along a second direction. The first trench and the second trench connect to each other at an intersection point. The method also includes filling an insulating material in the first trench and the second trench. The method also includes forming a contact plug at the intersection point, wherein the contact plug directly contacts the first semiconductor layer.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1:
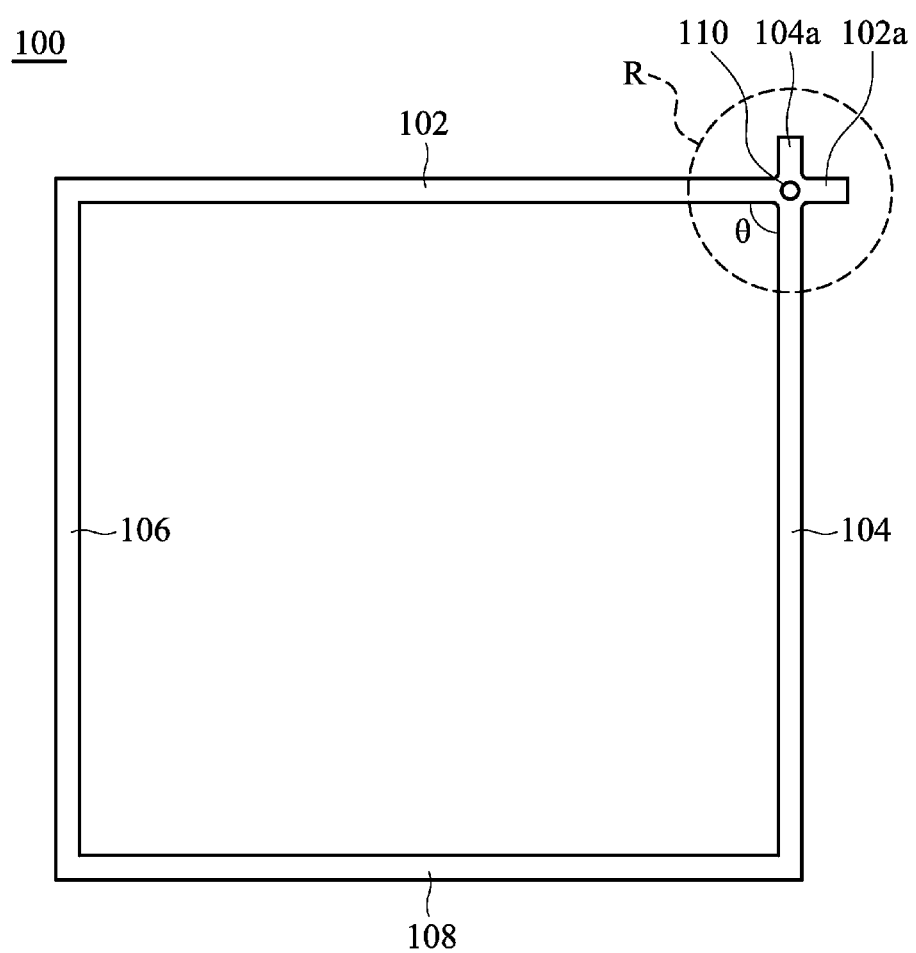
FIG. 1 shows a top view of a top-side contact structure in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In the figures and the specification of the present disclosure, the same reference numerals and/or letters refer to the same components.

The disclosure provides a top-side contact structure and a method for fabricating the top-side contact structure. FIG. 1 shows a top view of a top-side contact structure 100 in accordance with some embodiments.

Referring to FIG. 1, the top-side contact structure 100 may include a first trench 102, a second trench 104, a third trench 106, a fourth trench 108, and an intersection point 110 at a connecting position where the first trench 102 and the second trench 104 connect to each other. Each of the first trench 102, the second trench 104, the third trench 106, and the fourth trench 108 may have a high aspect ratio (an aspect ratio of greater than 10, for example), and insulating material may be filled in the trenches to form deep trench isolation (DTI) structures. Therefore, the first trench 102, the second trench 104, the third trench 106, and the fourth trench 108 may also be referred to as deep trench isolation structures 102, 104, 106 and 108.

In this embodiment, the first trench 102, the second trench 104, the third trench 106, and the fourth trench 108 form a closed rectangle in a top view, as shown in FIG. 1. Various semiconductor devices may be disposed in a region surrounded by the closed rectangle, and thus, the region may be referred to as a device region. The semiconductor devices in the device region may be electrically insulated from the external devices, because first trench 102, the second trench 104, the third trench 106, and the fourth trench 108 may form deep trench isolation structures 102, 104, 106 and 108 in the subsequent process. It should be realized that the number and arrangement of the trenches 102, 104, 106 and 108 are merely examples and are not intended to be limiting. For example, in other embodiments, the trenches 102, 104, 106 and 108 may form a trapezoid, a rhombus, a parallelogram or another irregular quadrilateral in the top view. For example, in other embodiments, the number of the trenches may be three, five, or other number, and these trenches form a closed polygon in the top view.

Referring to FIG. 1, the intersection point 110 located at the connecting position of the first trench 102 and the second trench 104. A contact plug will be self-aligned and formed at the center of the intersection point 110. The details will be discussed in the following paragraphs.

Figure 2:
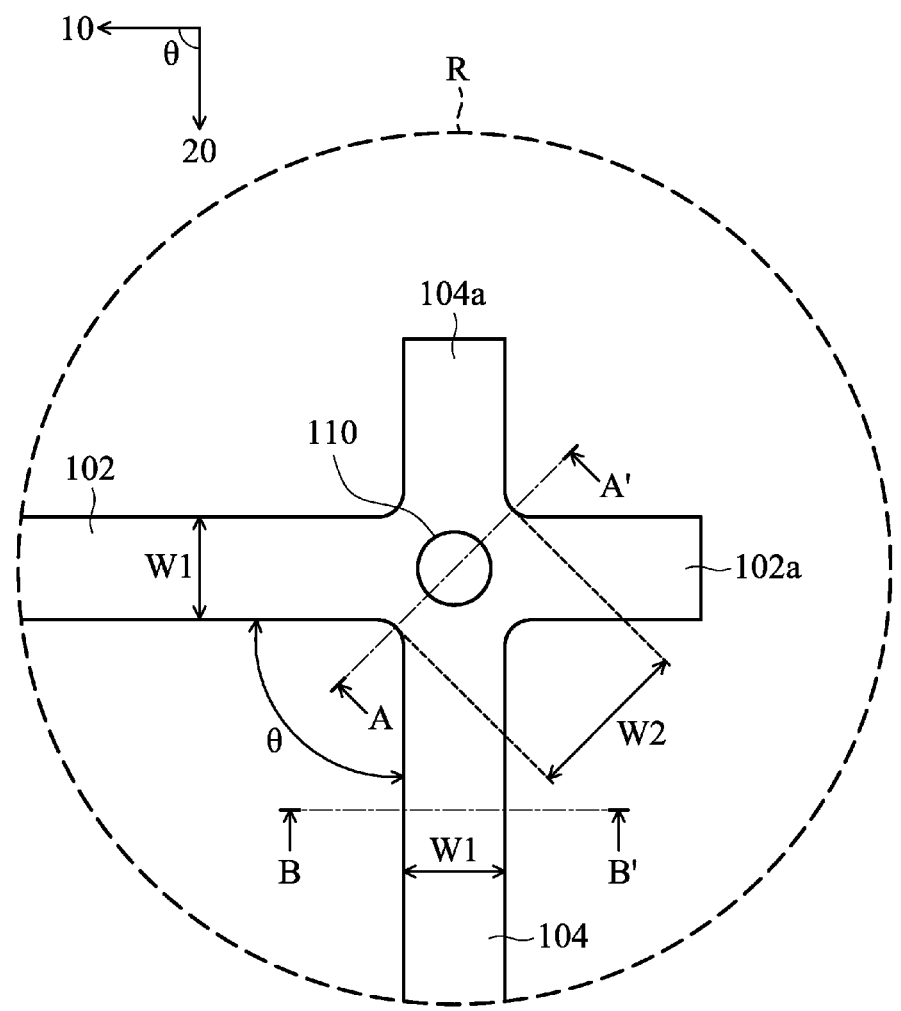
FIG. 2 shows an enlarged cross-sectional view of the region R of FIG. 1.

Referring to FIG. 2, it shows an enlarged cross-sectional view of the region R of FIG. 1. The first trench 102 extends along a first direction 10, and the second trench 104 extends along a second direction 20. The first direction 10 and the second direction 20 have an included angle θ. It should be noted that the subsequent process for forming the contact plug will be negatively affected if the included angle θ is too large or too small. The details will be discussed in the following paragraphs. In some embodiments, the included angle θ is in a range from 30 to 150 degrees. In other embodiments, the included angle θ is in a range from 60 to 120 degrees. In this embodiment, the included angle θ is 90 degrees.

FIGS. 3A-3H show cross-sectional views of various stages of forming a top-side contact structure 200 in accordance with some embodiments. FIGS. 3A-3H are cross-sectional representations taken along line A-A' of FIG. 2.

Figure 3A:
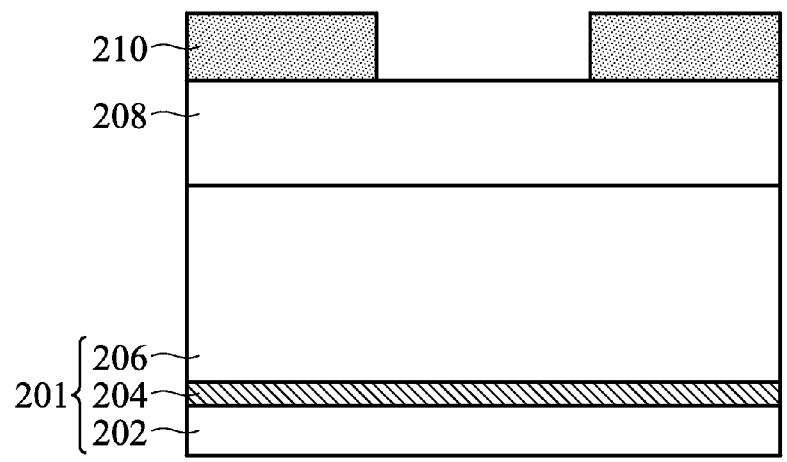
FIGS. 3A-3H show cross-sectional views of various stages of forming a top-side contact structure in accordance with some embodiments.

Referring to FIG. 3A, a hard mask layer 208 is formed on a substrate 201, and a patterned photoresist layer 210 on the hard mask layer 208. In some embodiments, the substrate 201 may include a silicon on insulator (SOI) structure. An insulating layer 204 and the subsequent DTI structures may form a closed, electrically insulating region, and the closed, electrically insulating region corresponds to the device region. As a result, the semiconductor devices in the device region may be electrically insulated from the external devices. In this embodiment, the substrate 201 may include a stacked structure having a first semiconductor layer 202, an insulating layer 204, and a second semiconductor layer 206 stacked from bottom to top sequentially. In some embodiments, the first semiconductor layer 202 and the second semiconductor layer 206 may respectively include silicon (Si), germanium (Ge), silicon-germanium (SiGe), Group III-V material (such as, gallium arsenide (GaAs), indium arsenide (InAs)), Group II-VI material (such as, zinc selenide (ZnSe), zinc sulfide (ZnS)), or other applicable semiconductor material. In some embodiments, the first semiconductor layer 202 and the second semiconductor layer 206 may be formed by an epitaxial growth process or another applicable process. In some embodiments, the insulating layer 204 may include buried oxide (BOX), and may be formed by ion implantation and annealing process.

The hard mask layer 208 may include oxide, nitride, oxynitride, other applicable dielectric material, or combinations thereof. In the subsequent process, the substrate 201 is etched by using the hard mask layer 208 as a mask.

The patterned photoresist layer 210 is used to define the trenches 102, 104, 106 and 108 in FIG. 1. The patterned photoresist layer 210 is formed by coating a photoresist layer and patterning the photoresist layer by lithography or another applicable process.

Figure 3B:
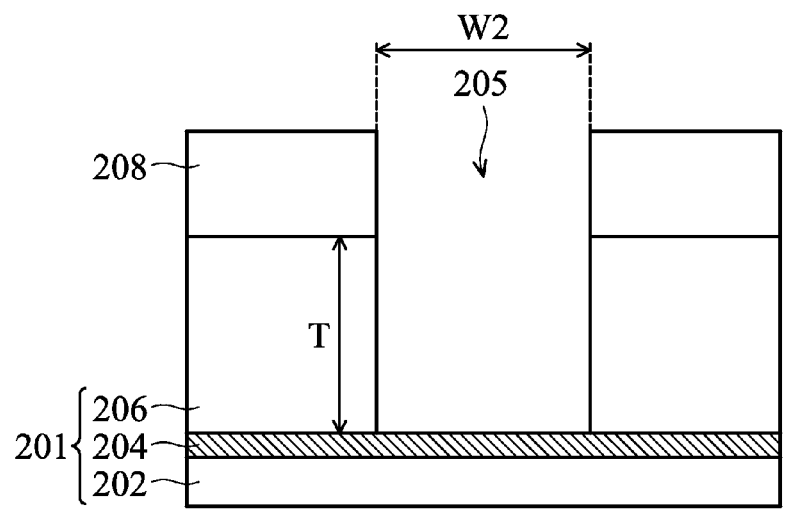

Referring to FIG. 3B, after the patterned photoresist layer 210 is formed, the hard mask layer 208 and the second semiconductor layer 206 is etched by using the patterned photoresist layer 210 as a mask. The hard mask layer 208 and the second semiconductor layer 206 is etched through by an etching process to form a trench 205. The etching process is continued until a top surface of the insulating layer 204 is exposed. FIG. 3B is cross-sectional representation taken along line A-A' of FIG. 2, and therefore the trench 205 corresponds to the intersection point 110 of the first trench 102 and the second trench 104. The etching process may include dry etching. In some embodiments, the etching process may be a reactive ion etching (RIE) process, such that the trench 205 with a higher aspect ratio is formed, which facilitate the subsequent formation of the DTI structure.

Figure 3C:
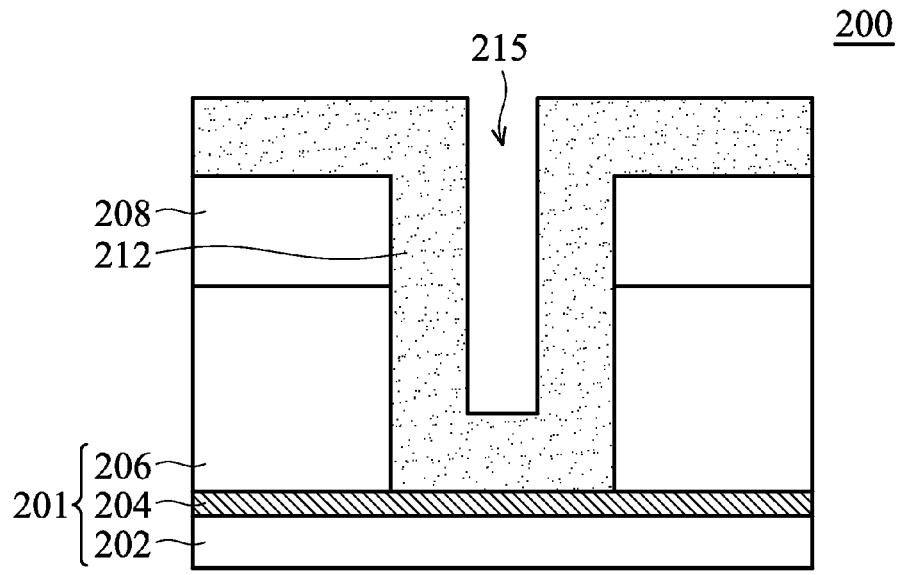

Referring to FIG. 3C, after the trench 205 is formed, an insulating material 212 is conformally deposited on the surface of the hard mask layer 208 and filled in the trench 205. As shown in FIG. 3C, the insulating material 212 is not only on the surface of the hard mask layer 208 but also on the sidewalls and bottom of the trench 205. The insulating material 212 may include oxide, nitride, oxynitride, carbide, other applicable material, or combinations thereof. The insulating material 212 may be deposited by an applicable process, such as an atmospheric pressure chemical vapor deposition (APCVD) process, a high-density plasma chemical vapor deposition (HD-PCVD) process, a flowable chemical vapor deposition process, or the like. In some embodiments, the insulating material 212 is oxide and is formed by an HDP-CVD process.

In this embodiment, the trench 205 at the connecting position of the first trench 102 and the second trench 104 is not completely filled by the insulating material 212, and therefore a contact hole 215 is formed at the center of the trench 205, as showed in FIG. 3C. The contact hole 215 will form a top-side contact structure in the subsequent process.

Figure 3D:
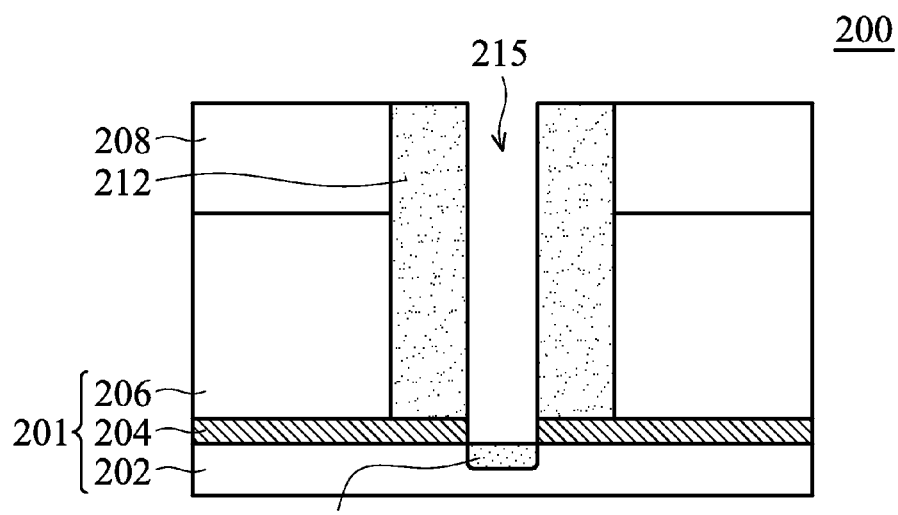
Figure 3E:
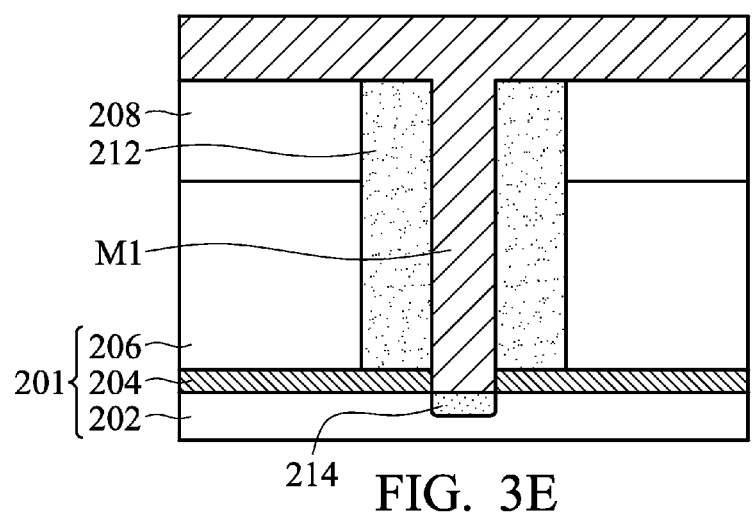
Figure 3F:
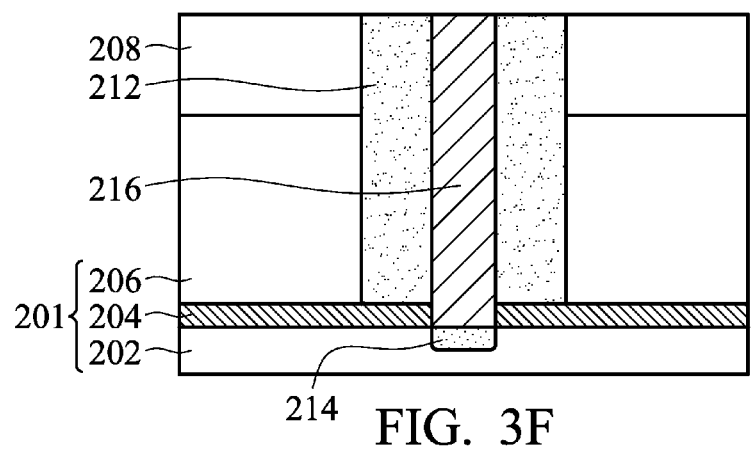
Figure 3G:
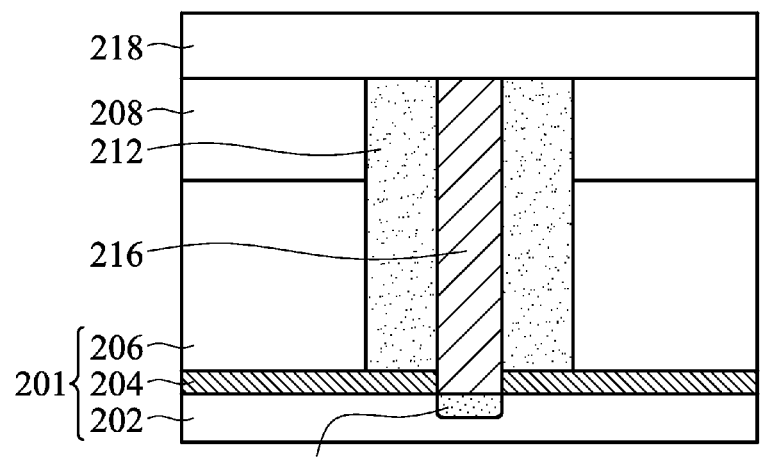
Figure 3H:
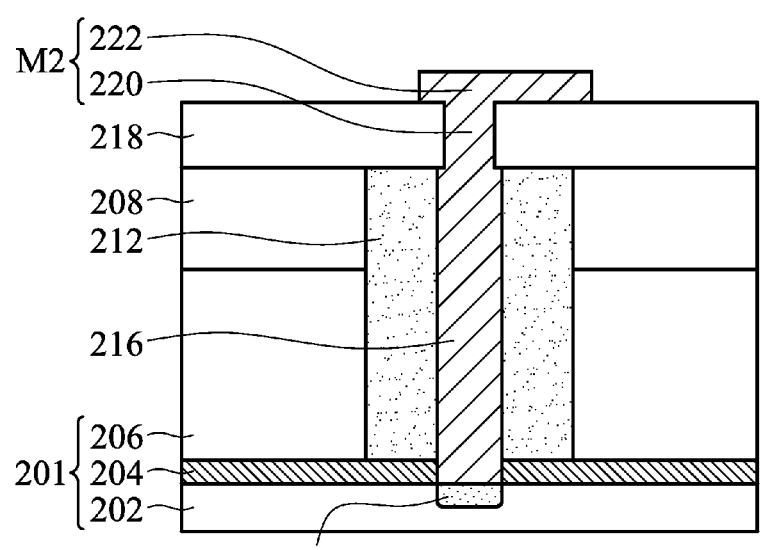
Figure 4:
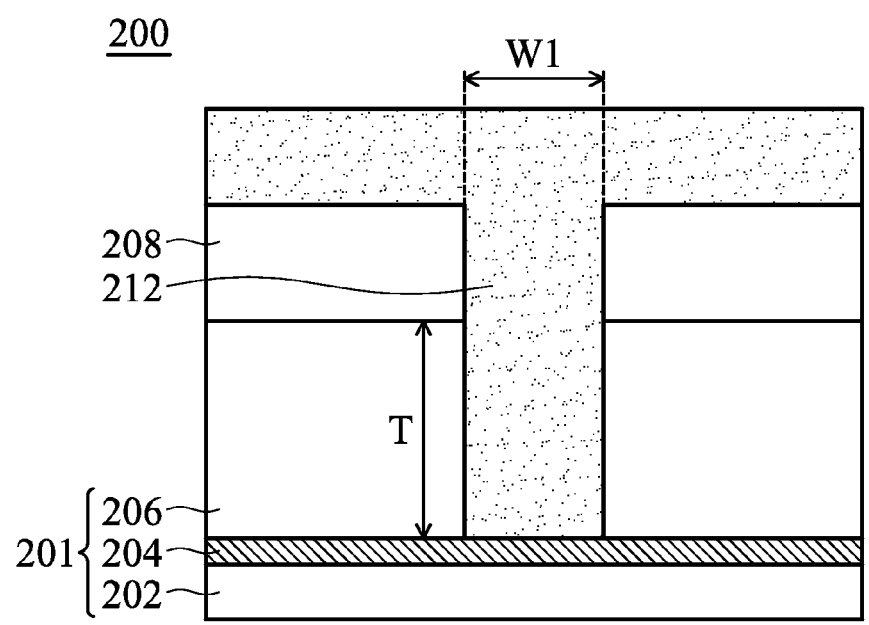
FIG. 4 shows a cross-sectional view of one stage of forming a top-side contact structure in accordance with some embodiments.

FIG. 4 shows a cross-sectional view of one stage of forming a top-side contact structure 200 in accordance with some embodiments. FIG. 4 and FIG. 3 correspond to the same stage (i.e., after depositing the insulating material 212) of forming the top-side contact structure, and the difference is that FIG. 4 is cross-sectional representation taken along line B-B' of FIG. 2. Referring to FIG. 4, the trench 205 outside connecting position of the first trench 102 and the second trench 104 is completely filled by the insulating material 212, and therefore no contact hole is formed in the trench 205.

Referring to FIG. 2, in this embodiment, the first trench 102 and the second trench 104 has the same width w1. The trench at the connecting position of the first trench 102 and the second trench 104 has a diagonal width w2. Because the included angle θ is 90 degrees, the diagonal width w2 should be 1.414 times as great as the width w1 according to the calculation of trigonometric function. Furthermore, because of the corner rounding effect resulting from the etching process, the trench at the connecting position of the first trench 102 and the second trench 104 is widened. Therefore, the diagonal width w2 should be greater than 1.414×w1.

In this disclosure, by controlling the depositing thickness of the insulating material 212, the trench 205 at the connecting position of the first trench 102 and the second trench 104 is not completely filled by the insulating material 212, while the portion outside the intersection point of the first trench 102 and the second trench 104 is completely filled. As a result, the contact hole 215 can be self-aligned and formed at the center of the intersection point of the first trench 102 and the second trench 104 without using an additional photomask.

Referring to FIG. 2 again, in order to form the contact hole at the intersection point of the first trench and the second trench, the ratio of the width of the first trench and the width of the second trench is maintained within a specific range. If the ratio of the width of the first trench and the width of the second trench is too high or too low, the diagonal width of the trench at the intersection point of the first trench and the second trench is not significantly greater than the width of the first trench and the second trench. As a result, the intersection point of the first trench and the second trench is completely filled, and therefore the contact hole cannot be formed. In some embodiments, the ratio of the width of the first trench and the width of the second trench is in a range from 0.8 to 1.2. In some embodiments, the width of the first trench and the width of the second trench are substantially the same.

Furthermore, referring to FIG. 2, in order to form the contact hole at the intersection point of the first trench and the second trench, the included angle θ between the first direction 10 and the second direction 20 is maintained within a specific range. If the included angle θ is too large or too small, the diagonal width of the trench at the intersection point of the first trench and the second trench will not be significantly greater than the width of the first trench and the second trench. Similarly, the intersection point of the first trench and the second trench is completely filled, and therefore the contact hole cannot be formed. In some embodiments, the included angle θ is in a range from 30 to 150 degrees. In other embodiments, the included angle θ is in a range from 60 to 120 degrees. In this embodiment, the included angle θ is 90 degrees.

The inventor of this disclosure has discovered that the ratio (T/W1) of the thickness T of the second semiconductor layer and the width w1 of the trench is also one of the important parameters that affect the formation of the contact hole. When the ratio (T/W1) of the thickness T of the second semiconductor layer and the width w1 of the trench is too large, control of the gap-filling ability of the insulating material becomes more difficult. In other words, the thickness of the insulating material on the sidewalls of the trench may not be uniform. If the thickness of the insulating material on the sidewalls of the trench is too thick, the insulating material on the two sidewalls may connect to each other, and therefore the contact hole cannot be formed at the intersection point of the first trench and the second trench. On the other hand, if the thickness of the insulating material on the sidewalls of the trench is too thin, the insulating ability of the DTI structure may be poor, and therefore the undesired leakage current may occur. Moreover, when the ratio (T/W1) of the thickness T of the second semiconductor layer and the width w1 of the trench is too large, the etching of the insulating material on the bottom of the contact hole and the underlying insulating layers becomes more difficult. As a result, the first semiconductor layer cannot be exposed, and the substrate cannot electrically connect to the subsequent contact plug. In some embodiments, the thickness T of the second semiconductor layer is 1-8 times as great as the width w1 of the trench (i.e., the value of T/W1 is in a range from 1 to 8). In some embodiments, the thickness T of the second semiconductor layer is 3-6 times as great as the width w1 of the trench (i.e., the value of T/W1 is in a range from 3 to 6).

Referring to FIG. 3D, after the insulating material 212 is deposited, an etching back process is performed to remove the insulating material 212 and the insulating layer 204 under the contact hole 215, until the top surface of the first semiconductor layer is exposed. The insulating material 212 on the hard mask layer 208 is also removed by the etching back process. The etching back process results in the contact hole 215 extending through the insulating layer 204 and exposing the top surface of the first semiconductor layer 202. Then, an implantation process is performed to form an implanting region 214 under the exposed surface of the first semiconductor layer 202. Then, an annealing process is performed to activate the dopant in the implanting region 214. The resistance of the implanting region 214 is reduced after the annealing process, and therefore the implanting region 214 can electrically connect to the subsequent contact plug.

Referring to FIG. 3E, a first conductive material M1 is deposited on the hard mask layer 208 and the insulating material 212 and filled in the contact hole 215. The first conductive material M1 may include doped poly silicon, metal, alloy, metal silicide and other applicable materials. The first conductive material M1 may be deposited by chemical vapor deposition (CVD), physical vapor deposition (PVD), atomic layer deposition (ALD) or the like.

Referring to FIG. 3F, a planarization process (such as, chemical mechanical polishing process) is performed to remove the excess first conductive material M1 outside the contact hole 215, and therefore a contact plug 216 is formed at the intersection point 110 of the first trench 102 and the second trench 104. The contact plug 216 directly contacts the first semiconductor layer 202 and electrically connects to the implanting region 214 in the first semiconductor layer 202, which is advantageous when subsequently applying bias or ground to the substrate 201.

Referring to FIG. 3G, a dielectric layer 218 is formed on the hard mask layer 208, the insulating material 212 and the contact plug 216. The dielectric layer 218 may protect and electrically isolate the top surface of the device region. The dielectric layer 218 may include oxide, nitride, carbide, or other applicable materials.

Referring to FIG. 3H, a patterning process is performed to form a through hole in the dielectric layer 218 and corresponding to the position of the contact plug 216. Then, a second conductive material M2 is deposited on the dielectric layer 218 and filled in the through hole. Then, the second conductive material M2 is patterned to form through a hole plug 220 and a conductive line 222. The substrate 201 may electrically connect to the external devices by the contact plug 216, the through-hole plug 220 and the conductive line 222. The material and the formation method of the second conductive material M2 may be the same as or similar to those of the first conductive material M1 and the detailed will not be repeated here.

In prior art, the bottom-side contact structure is formed by forming the contact hole on the back side (i.e., the opposite side related to the front side where the devices formed on) of the substrate and then filling the conductive material in the contact hole. In order to form the bottom-side contact structure, an additional protecting layer or dielectric layer must be formed on the back side of the substrate. Furthermore, in order to form electrical contact point at the desired position, an additional photomask must be used for patterning the additional protecting layer or dielectric layer. Therefore, both the process complexity and the manufacturing cost of the bottom-side contact structure are quite high.

Moreover, the top-side contact structure is formed by forming the contact hole on the front side (i.e., the side where the devices formed on) of the substrate and then filling the conductive material in the contact hole. In prior art, in order to form the bottom-side contact structure, an additional photomask is still necessary for defining the position of the contact hole. In addition, the top-side contact structure formed in the device region will occupy the effective area for the devices, which is disadvantageous for the miniaturization of the semiconductor device.

The disclosure provides a fabrication method of a top-side contact structure. The fabrication method incorporates the forming processes of the top-side contact structure with the forming the DTI structure. In comparison with conventional fabrication methods of the bottom-side contact structure or the top-side contact structure, the fabrication method of this disclosure can use fewer photomasks and significantly reduce both the process complexity and the manufacturing cost. Furthermore, the top-side contact structure of this disclosure is formed in the DTI structure and occupies no effective area for the devices, which is advantageous for the miniaturization of the semiconductor device.

Referring back to FIG. 1, trenches 102, 104, 106, and 108 form a closed rectangle. The first trench 102 includes a protrusion 102a extending outside the closed rectangle. Similarly, the second trench 104 includes a protrusion 104a extending outside the closed rectangle. As mentioned above, because of the corner rounding effect resulting from the etching process, the trench at the connecting position of the first trench 102 and the second trench 104 is widened. In this embodiment, the first trench 102 and the second trench 104 respectively include the protrusions 102*a* and 104*a*, and therefore the first trench 102 and the second trench 104 form a "cross" at the intersection point 110. Because all the four corners of the intersection point 110 are rounded, the diagonal width of the intersection point 110 can be significantly induced. As a result, the difference between the diagonal width and the trench width is increased, which is advantageous for forming the contact hole at the intersection point 110.

Figure 5:
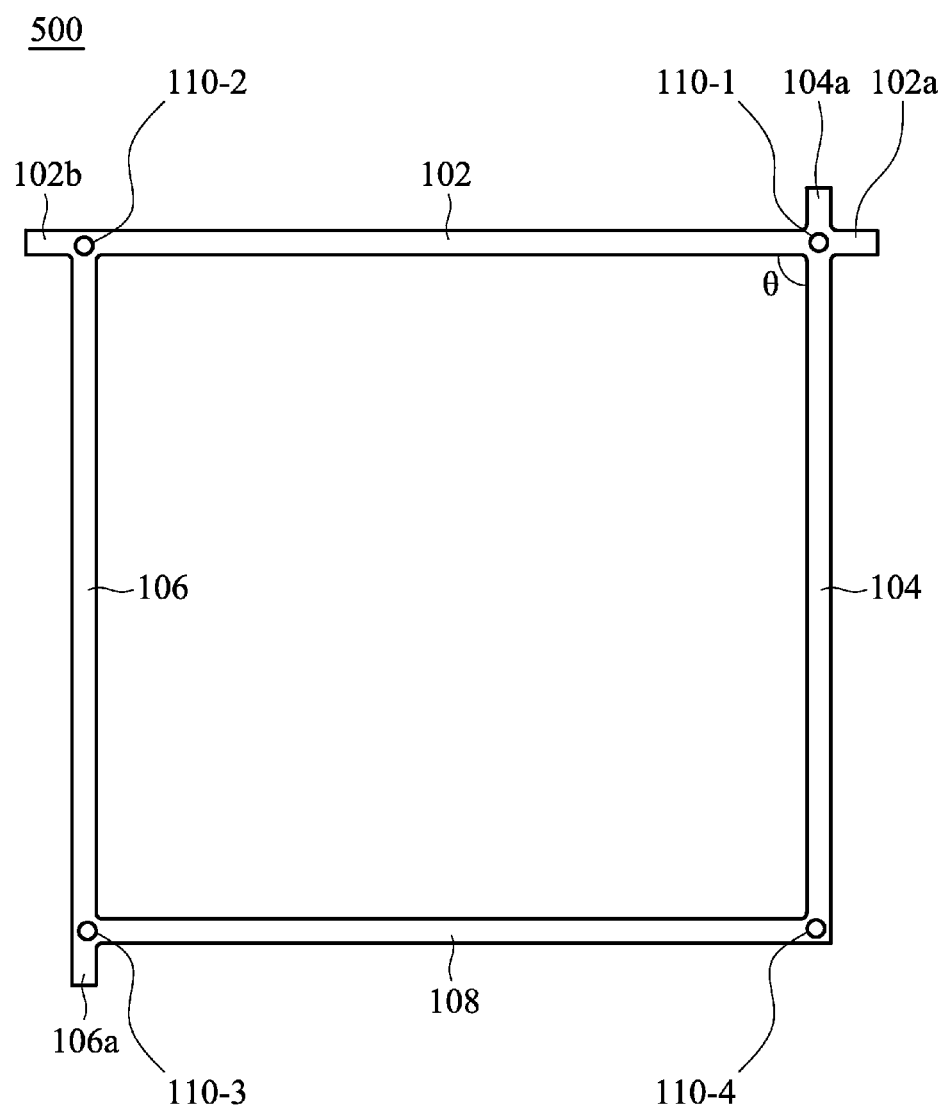
FIG. 5 shows a top view of a top-side contact structure in accordance with other embodiments.

FIG. 5 shows a top view of a top-side contact structure 500 in accordance with other embodiments. As shown in FIG. 5, at the intersection point 110-1, the first trench 102 and the second trench 104 respectively include the protrusions 102*a* and 104*a* extending outside the closed rectangle. At the intersection point 110-2, the first trench 102 includes the protrusions 102*a* extending outside the closed rectangle, and the third trench 106 includes no protrusion extending outside the closed rectangle. Similarly, at the intersection point 110-3, the third trench 106 includes the protrusions 106*a* extending outside the closed rectangle, and the fourth trench 108 includes no protrusion extending outside the closed rectangle. At the intersection point 110-4, both the second trench 104 and the fourth trench 108 include no protrusion extending outside the closed rectangle. In this embodiment, the two trenches connecting to each other form a "T-shape" at the intersection points 110-2 and 110-3, and form an "L-shape" at the intersection points 110-4. At the intersection points 110-2, 110-3, and 110-4, since only one of the two diagonal corners will be rounded, the increase of the diagonal width will be smaller than that at the intersection point 110-1. If there is need to form the contact hole at the intersection points 110-2, 110-3, and 110-4, it is more important to control the above parameters (such as, the ratio of the width of the two trenches, included angle θ, and the ratio of the thickness of the second semiconductor layer and the width).

It should be noted that the arrangement of the trenches 102, 104, 106, and 108 shown in FIG. 5 is merely examples and is not intended to be limiting. For example, in other embodiments, the intersection points may respectively include zero, one or two protrusions.

In addition, if the length of the protrusion is too short, the diagonal width cannot be increased significantly due to poor corner rounding effect. On the other hand, if the length of the protrusion is too long, the protrusion will occupy the effective area for the devices, which is disadvantageous for the miniaturization of the semiconductor device. In some embodiments, the length of the protrusion is in a range from 0.2 to 5 µm. In some embodiments, the length of the protrusion is in a range from 0.5 to 2 µm.

In accordance with some embodiments of the disclosure, a plurality of first trenches extending along a first direction may be formed, and a plurality of second trenches extending along a second direction perpendicular to the first direction may be formed. In such embodiments, a plurality of device regions may be formed in array, and the above top-side contact structure may be formed at each intersection point. As a result, the process is simplified significantly and the manufacturing cost is reduced.

In comparison with conventional fabrication methods, the advantage of the fabrication method of the top-side contact structure in this disclosure includes incorporating the forming processes of the top-side contact structure with the forming the DTI structure. Therefore, the fabrication method can use fewer photomasks and significantly reduce both the process complexity and the manufacturing cost. Furthermore, the top-side contact structure of this disclosure is formed in the DTI structure and occupies no effective area for the devices, which is advantageous for the miniaturization of the semiconductor device.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:
1. A top-side contact structure, comprising:
 a substrate comprising a first semiconductor layer, an insulating layer on the first semiconductor layer, and a second semiconductor layer on the insulating layer;
 a first trench formed in the second semiconductor layer and extending along a first direction;
 a second trench formed in the second semiconductor layer and extending along a second direction, wherein the first trench and the second trench connect to each other at an intersection point;
 an insulating material filling the first trench and the second trench; and
 a contact plug formed at the intersection point and directly contacting the first semiconductor layer.
2. The top-side contact structure as claimed in claim 1, wherein an included angle between the first direction and the second direction is in a range from 60 to 120 degrees.
3. The top-side contact structure as claimed in claim 1, wherein the contact plug is self-aligned and formed at a center of the intersection point.
4. The top-side contact structure as claimed in claim 1, wherein a width of the first trench and a width of the second trench are substantially the same.
5. The top-side contact structure as claimed in claim 4, wherein a ratio of a thickness of the second semiconductor layer to a thickness of the first semiconductor layer is 3-6.
6. The top-side contact structure as claimed in claim 1, wherein a ratio of the width of the first trench to the width of the second trench is 0.8-1.2.
7. The top-side contact structure as claimed in claim 1, further comprising at least one trench formed in the second semiconductor layer, wherein the first trench, the second trench and the at least one trench form a closed polygon in a top view.
8. The top-side contact structure as claimed in claim 7, wherein the first trench further comprises a protrusion extending outside the closed polygon in the top view.
9. The top-side contact structure as claimed in claim 8, wherein a length of the protrusion is in a range from 0.5 to 2 µm.
10. The top-side contact structure as claimed in claim 7, wherein both the first trench and the second trench do not comprise a protrusion extending outside the closed polygon in the top view.
11. The top-side contact structure as claimed in claim 1, further comprising:
 a dielectric layer formed on the second semiconductor layer;
 a through hole formed in the dielectric layer and aligned to the contact plug; and
 a through-hole plug filling the through hole and directly contacting the contact plug.
12. A method for fabricating a top-side contact structure, comprising:

providing a substrate, wherein the substrate comprises a first semiconductor layer, an insulating layer on the first semiconductor layer, and a second semiconductor layer on the insulating layer;

forming a first trench formed in the second semiconductor layer and extending along a first direction;

forming a second trench formed in the second semiconductor layer and extending along a second direction, wherein the first trench and the second trench connect to each other at an intersection point;

filling an insulating material in the first trench and the second trench; and forming a contact plug at the intersection point, wherein the contact plug directly contacts the first semiconductor layer.

13. The method as claimed in claim 12, wherein forming the contact plug comprises:

conformally depositing the insulating material on a bottom and sidewalls of the intersection point of the first trench and the second trench;

performing an etching back process to remove the insulating material on the bottom and the insulating layer under the insulating material, thereby forming a contact hole exposing the first semiconductor layer; and filling a conductive material in the contact hole to form the contact plug.

14. The method as claimed in claim 12, wherein an included angle between the first direction and the second direction is in a range from 60 to 120 degrees.

15. The method as claimed in claim 12, wherein a ratio of a thickness of the second semiconductor layer to a thickness of the first semiconductor layer is 3-6.

16. The method as claimed in claim 12, further comprising forming at least one trench formed in the second semiconductor layer, wherein the first trench, the second trench and the at least one trench form a closed polygon in a top view.

17. The method as claimed in claim 16, wherein the first trench further comprises a protrusion extending outside the closed polygon in the top view.

18. The method as claimed in claim 17, wherein a length of the protrusion is in a range from 0.5 to 2 µm.

19. The method as claimed in claim 16, wherein both the first trench and the second trench do not comprise a protrusion extending outside the closed polygon in the top view.

20. The method as claimed in claim 12, further comprising:

forming a dielectric layer on the second semiconductor layer; and forming a through-hole plug in the dielectric layer, wherein the through-hole plug directly contacts the contact plug.

* * * * *